(12) United States Patent
Skotnicki et al.

(10) Patent No.: US 6,537,894 B2
(45) Date of Patent: Mar. 25, 2003

(54) PROCESS FOR FABRICATING A SUBSTRATE OF THE SILICON-ON-INSULATOR OR SILICON-ON-NOTHING TYPE AND RESULTING DEVICE

(75) Inventors: Thomas Skotnicki, Crolles Montfort (FR); Michel Haond, Grësivaudan (FR); Didier Dutartre, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/920,315

(22) Filed: Aug. 1, 2001

(65) Prior Publication Data

US 2002/0076899 A1 Jun. 20, 2002

(30) Foreign Application Priority Data

Aug. 2, 2000 (FR) .............................. 00 10176

(51) Int. Cl.$^7$ .............................................. H01L 21/76
(52) U.S. Cl. ...................... 438/424; 438/738; 438/739; 438/752
(58) Field of Search ................................. 205/124, 136; 257/347–354; 438/149, 152–156, 309, 311, 409, 424, 479, 517, 738, 739, 752

(56) References Cited

U.S. PATENT DOCUMENTS

| 4,849,370 A | 7/1989 | Spratt et al. |
| 6,383,924 B1 * | 5/2002 | Farrar et al. ................ 438/667 |
| 2002/0094651 A1 * | 7/2002 | Farrar ......................... 438/296 |

FOREIGN PATENT DOCUMENTS

| EP | 0957515 A1 | 11/1999 |
| FR | 2 795 554 | 12/2000 |

OTHER PUBLICATIONS

"MOS Transistors with Bottom–Isolated Source/Drain Regions," Research Disclosure, Kenneth Mason Publications, Hampshire, GB, No. 398, pp. 378–379, XP000726504, ISSN: 0374–4353, Jun. 1, 1997.
French Preliminary Search Report dated Apr. 17, 2001 for French Application No. 00–10176.

* cited by examiner

*Primary Examiner*—Kamand Cuneo
*Assistant Examiner*—Asok Kumar Sarkar
(74) *Attorney, Agent, or Firm*—Lisa K. Jorgenson; Stephen Bongini; Fleit, Kain, Gibbons, Gutman & Bongini P.L.

(57) ABSTRACT

Processes are provided for fabricating a substrate having a silicon-on-insulator (SOI) or silicon-on-nothing (SON) architecture, which are applicable to the manufacture of semiconductor devices, especially transistors such as those of the MOS, CMOS, BICMOS, and HCMOS types. In the fabrication processes, a multilayer stack is grown on a substrate by non-selective full-wafer epitaxy. The multilayer stack includes a silicon layer on a Ge or SiGe layer. Active regions are defined and masked, and insulating pads are formed so as to be located around the perimeter of each of the active regions at predetermined intervals and placed against the sidewalls of the active regions. The insulating trenches are etched, and the SiGe or Ge layer is laterally etched so as to form an empty tunnel under the silicon layer. The trenches are filled with a dielectric. In the case of an SOI archiutecture, the tunnel is filled with a dielectric.

19 Claims, 7 Drawing Sheets

PROCESS FOR FABRICATING A SUBSTRATE OF THE SILICON-ON-INSULATOR OR SILICON-ON-NOTHING TYPE AND RESULTING DEVICE

CROSS-REFERENCE TO RELATED APPLICATIONS

This application is based upon and claims priority from prior French Patent Application No. 00-10176, filed Aug. 2, 2000, the entire disclosure of which is herein incorporated by reference.

BACKGROUND OF THE INVENTION

1. Field of the Invention

The present invention relates to semiconductor device fabrication, and more specifically to a process for fabricating a substrate having a "silicon-on-insulator" or "silicon-on-nothing" architecture.

2. Description of Related Art

A "silicon-on-insulator" (SOI) or "silicon-on-nothing" (SON) architecture with thin silicon films and, where appropriate, a buried dielectric is particularly desirable for its properties with respect to control of short channel effects. These properties mainly result from the fact that the very thin silicon film in which the semiconductor device is produced helps control the gate on the channel, while handicapping control via the source and drain. With regard to the very thin buried dielectric film, this handicaps electrostatic coupling between the source and drain through the buried dielectric.

Currently, commercially-available SOI substrates are incapable of providing sufficiently small silicon film thicknesses and buried dielectric thicknesses to allow effective control of the gate over the channel, and therefore of the short channel effects. In particular, film thicknesses of at most 20 nm in the case of the silicon and at most 30 nm in the case of the dielectric would be necessary. The current silicon film thicknesses are at least 50 nm and those of the buried dielectric are at least 80 nm. In both cases, it must be assumed that there is a scatter of ±10 nm. Such a scatter prevents the obtaining of a nanometric silicon film by localized thinning of the SOI substrate (for example, through a LOCOS process).

Certain techniques can be used to reduce the thickness of the silicon layer, such as the "wafer bonding" and "smart-cut" techniques. However, both of these techniques rely on the use of two wafers of initial substrate and expensive processes involving implantation, oxidation, chemical-mechanical polishing, almost complete abrasion of the substrate, etc.

SUMMARY OF THE INVENTION

In view of these drawbacks, it is an object of the present invention to overcome the above-mentioned drawbacks and to provide a simple and inexpensive process for fabricating a SOI or SON substrate on which a semiconductor device can be produced.

Another object of the present invention is to provide a process for fabricating a SOI or SON substrate from a single bulk silicon substrate, without the use of chemical-mechanical polishing or substrate abrasion.

Yet another object of the present invention is to provide a process for fabricating a SOI or SON substrate that allows extremely thin silicon and buried dielectric layers to be obtained.

A further object of the present invention is to provide a substrate having at least one active region of SOI or SON architecture surrounded by insulating regions.

One embodiment of the present invention provides a method for fabricating a substrate of SOI architecture. According to the method, a multilayer stack is grown by non-selective full-wafer epitaxy on an initial substrate, with the multilayer stack including a Ge or SiGe alloy first layer and a silicon layer on the first layer. Active regions are defined and masked, and insulating pads are formed so as to be located on the perimeter of each of the active regions at predetermined intervals and placed against sidewalls of the active regions. Trenches are etched for separating the active regions, and the Ge or SiGe alloy first layer is laterally etched so as to form an empty tunnel under the silicon layer. The tunnel is filled with a dielectric material, and the trenches are filled with a dielectric material. In a preferred embodiment, the Ge or SiGe alloy first layer has a thickness of between about 1 and 50 nm, and the silicon layer has a thickness of between about 1 and 50 nm.

Another embodiment of the present invention provides a method for fabricating a substrate of SON architecture. According to the method, a multilayer stack is grown by non-selective full-wafer epitaxy on an initial substrate, with the multilayer stack including a Ge or SiGe alloy first layer and a silicon layer on the first layer. Active regions are defined and masked, and insulating pads are formed so as to be located on the perimeter of each of the active regions at predetermined intervals and placed against sidewalls of the active regions. Trenches are etched for separating the active regions, and the Ge or SiGe alloy first layer is laterally etched so as to form an empty tunnel under the silicon layer. The trenches are filled with a dielectric material. In a preferred embodiment, the Ge or SiGe alloy first layer has a thickness of between about 10 and 30 nm, and the silicon layer has a thickness of between about 5 and 20 nm.

Further embodiments of the present invention provide substrates that include at least one active region of SOI or SON architecture, insulating trench regions surrounding the active region, and insulating pads located in the insulating trench regions around the perimeter of the active region, and placed against sidewalls of the active region.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1A:
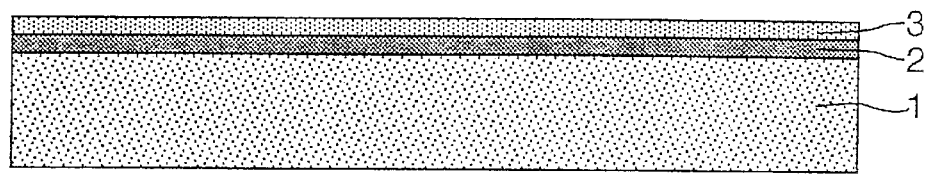
FIGS. 1a to 1i show a process for manufacturing a substrate of SOI architecture according to one embodiment of the present invention.

Preferred embodiments of the present invention will be described in detail hereinbelow with reference to the attached drawings.

Preferred embodiments of the present invention provide methods for fabricating a SOI or SON substrate from a single bulk silicon substrate, without the use of chemical-mechanical polishing or substrate abrasion. In one preferred embodiment of a process for fabricating a substrate of SOI architecture, a multilayer stack consisting of a Ge or SiGe alloy layer and then a silicon layer is grown by non-selective full-wafer epitaxy on an initial substrate. The active regions are defined and masked, and insulating pads are formed in the trench regions so as to be located on the perimeter of each of the active regions at predetermined intervals. Further, the trenches are etched, the SiGe or Ge layer is laterally etched, the tunnel is filled with a dielectric, and the trenches are filled with a dielectric. In an alternative embodiment for fabricating a substrate of SON architecture, this same process is carried out, except for the step of filling the tunnel with a dielectric.

The semiconductor material of the initial substrate is preferably silicon. Additionally, in preferred embodiments, the Ge or SiGe alloy layer and the overlying silicon layer are grown epitaxially to layer thicknesses of between 1 and 50 nm (and more preferably between 10 and 30 nm) and between 1 and 50 nm (and more preferably between 5 and 20 nm, respectively. In one embodiment, the insulating pads are formed by depositing a resin over the entire surface of the substrate, and using photolithography in order to form patterns of holes to be etched, located at defined intervals around the perimeter of the active regions and each overlapping active regions and the adjacent trench region. Holes are formed in the trench regions not covered by the resin through plasma etching, and the resin is removed. A dielectric is deposited in order to fill the holes, and then anisotropic etching is performed.

The steps of etching and filling the trenches are preferably carried out in accordance with STI technology. The filling dielectric can be $SiO_2$, which is normally used in this technology. In various embodiments, the tunnel is filled with a dielectric by thermally oxidizing the silicon layer, by conventionally depositing a dielectric, or by a hybrid process. In the case of deposition, any suitable dielectric can be used, and preferably $SiO_2$ is used. Additionally, the process preferably includes conventional finishing operations including the chemical-mechanical polishing of the dielectric filling the trenches and the dielectric of the insulating pads. The mask is then removed, as is the adjacent pedestal oxide deposited on the epitaxial silicon layer.

According to one embodiment of the process of the present invention, after the finishing operations, a bulk substrate region is made in the substrate by masking the SOI or SON region using a resin, and then removing the silicon and dielectric layers from the unmasked regions. This embodiment may be advantageous for removing the SOI or SON layers from large active regions in which the etching of the tunnel does not allow the SiGe or Ge to be completely removed. However, it can also be carried out on small active regions, depending on the requirements to work with bulk-type transistors produced in the bulk substrate, rather than in the SON or SOI layers. The dielectric and silicon layers can be removed using conventional etching methods (for example, by a plasma process).

In some embodiments of the process of the present invention, the multilayer stack is formed by repeating (as many times as desired) the silicon layer on SiGe or Ge layer pattern, by alternating the SiGe or Ge and silicon non-selective full-wafer epilayers. This is particularly advantageous for the purpose of three-dimensional integration of transistors produced in these SOI or SON layers. These different embodiments of the process can be combined according to the subsequent fabrication requirements for semiconductor devices.

Another preferred embodiment of the present invention provides a substrate having at least one active region of SOI or SON architecture surrounded by insulating regions. There are, formed on the substrate, a layer of a dielectric or an empty tunnel having a thickness of between 1 and 50 nm (preferably between 10 and 30 nm). On this dielectric layer or this void, there is a silicon layer having a thickness of between 1 and 50 nm (preferably between 5 and 20 nm), and located in the insulating regions around the perimeter of the active region and placed against the sidewalls of the active region there are insulating pads.

According to one embodiment, the substrate also has at least one bulk region of bulk substrate separated from the SOI or SON active region by insulating regions, and insulating pads located in the insulating regions around the perimeter of the bulk region and the SOI or SON region, placed against the sidewalls of the bulk and SOI or SON active regions. According to another embodiment of the present invention, the active region of SOI or SON architecture has, formed on the initial substrate, a multilayer stack including an alternation of insulating layers or empty tunnels having a thickness of between 1 and 50 nm (preferably between 10 and 30 nm) and silicon layers having a thickness of between 1 and 50 nm (preferably between 5 and 20 nm).

One embodiment of the present invention will now be explained in detail with reference to FIGS. 1a–1i. FIG. 1 shows a process for manufacturing a substrate of SOI architecture in accordance with one embodiment of the present invention. As shown in FIG. 1a, the process starts with the non-selective full-wafer epitaxial deposition of an SiGe or Ge first layer 2 over the entire surface of the initial substrate 1. This epitaxy is followed by a second non-selective full-wafer epitaxial deposition of a silicon layer 3. These layers have a thickness varying between 1 and 50 nm. The epitaxy is preferably taken so as to obtain a thickness of between 10 and 30 nm for the Ge or SiGe layer 2 adjacent to the initial substrate 1, and between 5 and 20 nm for the silicon layer 3.

SiGe alloys are well-known alloys. Among such alloys there are $Si_{1-x}Ge_x$ alloys, where $0 \leq x \leq 1$, and $Si_{1-x-y}Ge_xC_y$, where $0 \leq x \leq 0.95$ and $0 \leq y \leq 0.05$. An SiGe alloy having a Ge content where $x \geq 0.05$ will preferably be used because the selectivity of the etching with respect to Si increases with the increase of Ge content in the alloy.

Figure 1B:
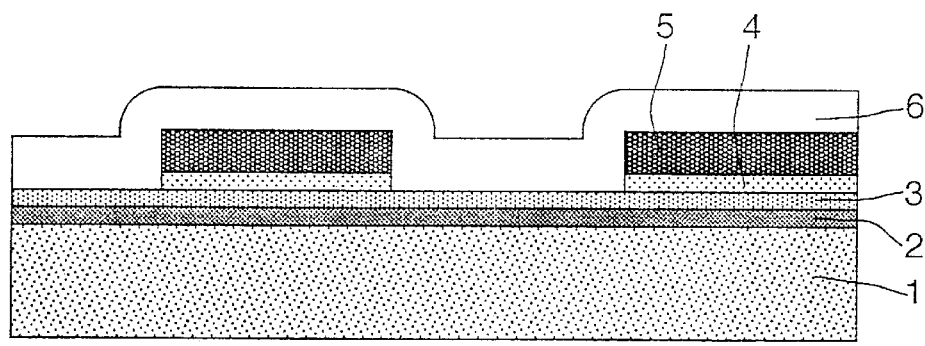

The process then continues with the definition and masking of the active regions and the preparation of the device for the purpose of forming the insulating pads. This stage of the process is illustrated in FIG. 1b. The active zones may be masked in accordance with STI technology. In particular, first there is deposited a pedestal silicon oxide layer 4 and on top of this there is then deposited a layer 5 of a stop material for the etching the holes and the trenches. For example, this material can be silicon nitride $Si_3N_4$. The regions not covered with the pedestal oxide and the stop material will become insulating trench regions for separating the active regions.

Figure 1C:
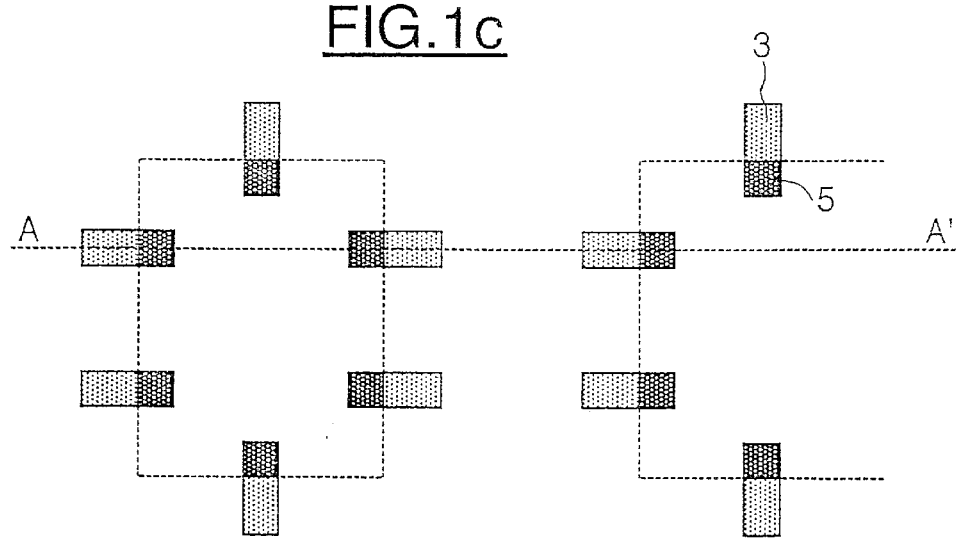

A photosensitive resin 6 is then deposited over the entire surface of the substrate. Next, this resin 6 is subjected to photolithography so as to define the patterns of holes for forming the insulating pads. FIG. 1c gives a top view after the patterns of holes have been defined. These patterns, which correspond to the regions not protected by the photosensitive resin, are distributed around the perimeter of the active regions at defined intervals and partially cover the active regions (the rectangles bounded by dotted lines in the figure) and the trench regions (the regions surrounding the rectangles bounded by the dotted lines in the figure). The purpose of this overlap is to ensure a certain margin of cover during the next steps in the worst case of misalignment. Thus, the subsequent etching of the holes allows the insulating pads to be positioned directly against the sidewalls of the active regions.

Figure 1D:
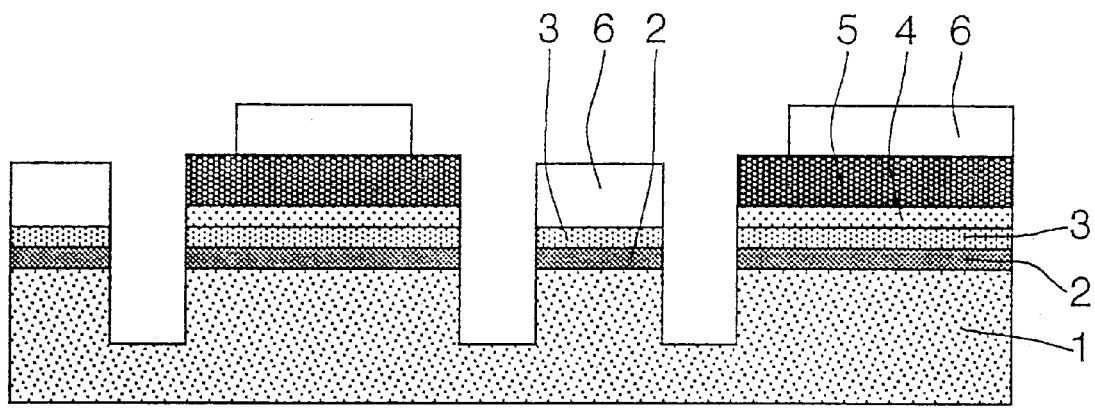
Figure 1E:
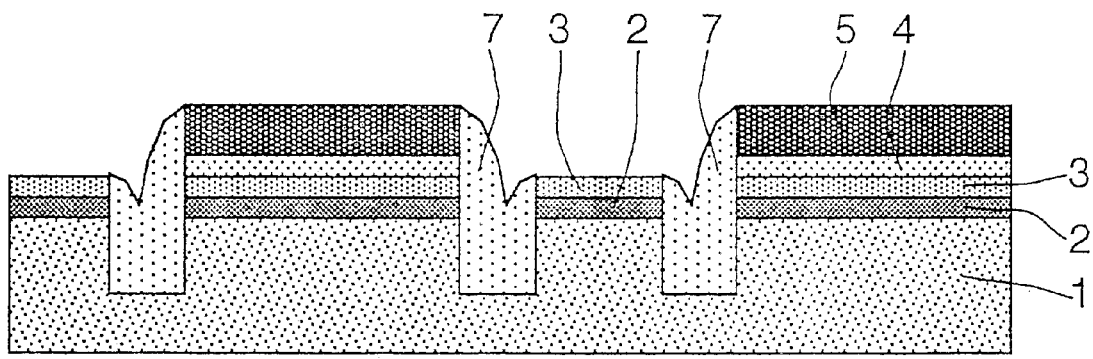

FIG. 1d shows a cross section along axis A–A' in FIG. 1c after the holes have been etched. Plasma etching is used, with the etching stopping on the stop material 5 (for example, silicon nitride), to protect the active regions and cut out holes in the trench regions not protected by the photosensitive resin 6 until there is a certain amount of penetration into the initial substrate 1 corresponding to the depth of the subsequent trenches. Next, pads 7 are formed, such as by depositing a dielectric (for example, $SiO_2$) whose purpose is to fill the previously formed holes. The process then continues with anisotropic etching. After the photosensitive resin 6 has been removed, the device shown in FIG. 1e is obtained.

Figure 1F:
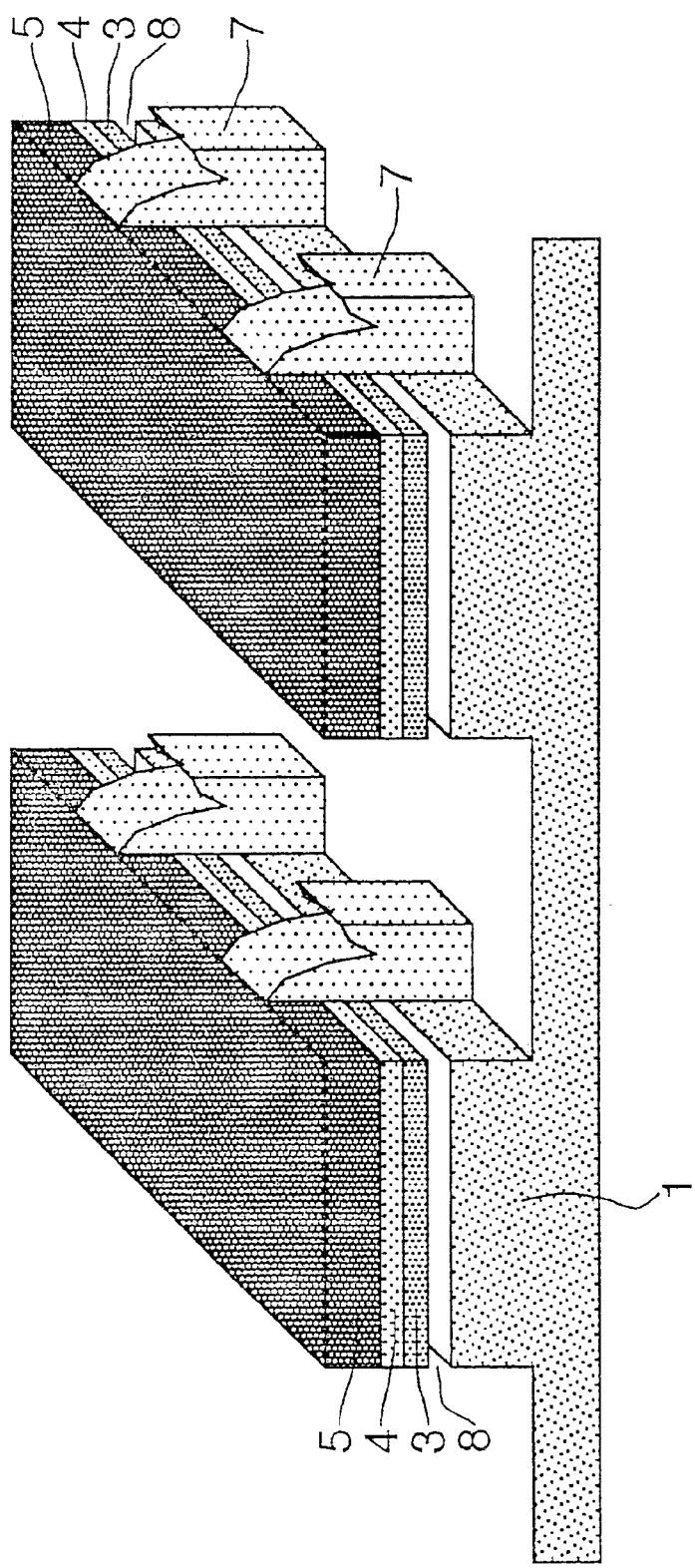

Next, the trenches are etched. This may be done using STI technology. Self-alignment of the trenches with the pads 7 is achieved by using the same nitride mask 5 for the formation of the pads 7 and the etching of the trenches. The process then continues with the removal of the SiGe or Ge layer 2 by selective lateral etching. Ge or SiGe can be easily removed, either by oxidizing chemistry (such as by etching with a solution having 40 ml of 70% $HNO_3$+20 ml of $H_2O_2$+5 ml of 0.5% HF) or by isotropic plasma etching. FIG. 1f illustrates a perspective view of the substrate after the etching of the trenches and lateral etching of the SiGe or Ge layer 2. In the active regions, there is an empty tunnel 8 on the initial substrate 1 under the silicon epilayer 3. The insulating pads 7 located around the perimeter of the active region at predetermined intervals and placed against its sidewalls maintain the structure.

In the exemplary embodiment illustrated in FIGS. 1a–1i, the tunnel 8 is then filled with a dielectric 9 for the purpose of fabricating an SOI substrate. It is possible to use any suitable dielectric, but preferably $SiO_2$ is used. The dielectric layer 9 is formed by thermal oxidation of the silicon layer, by a conventional deposition process, or else by a hybrid process. In a further embodiment, the walls of the tunnel 8 are passivated by thermal oxidation, and then the tunnel is completely filled with a dielectric different from $SiO_2$, such as $Si_3N_4$.

Figure 1G:
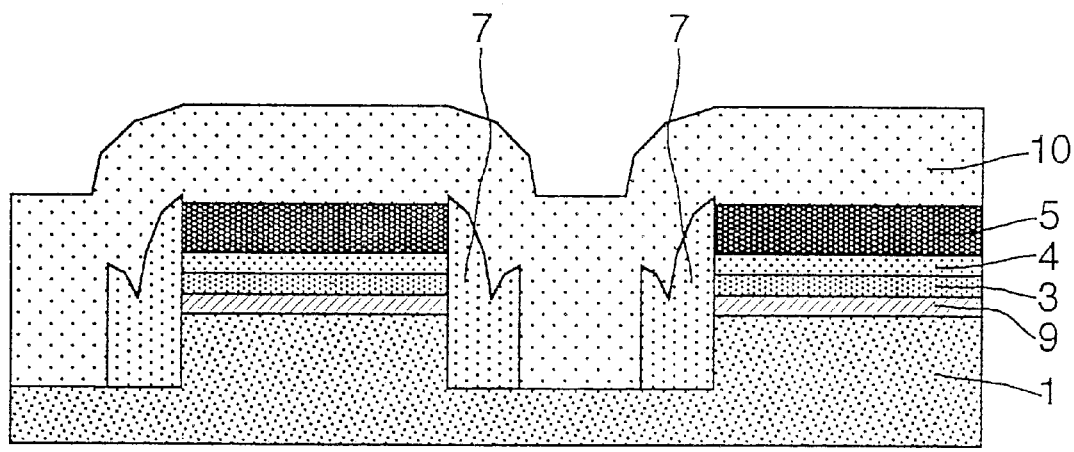
Figure 1H:
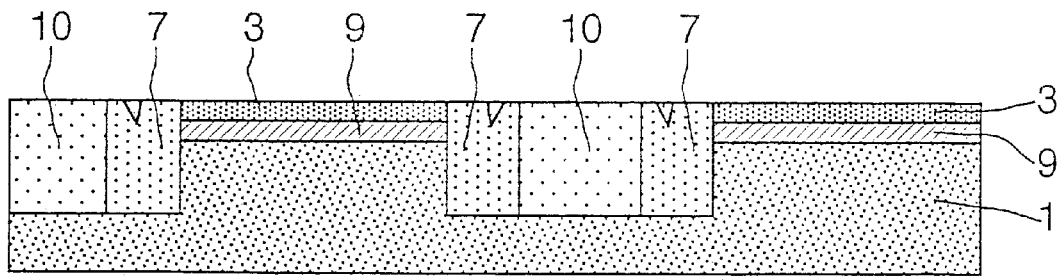

The process then continues with the filling of the trenches with a dielectric 10. This dielectric may be the same as that used in the STI process. The device illustrated in FIG. 1g is then obtained. As shown, the active regions on an initial substrate 1 include a multilayer stack consisting of a layer 9 of a dielectric and on this a silicon epilayer 3. A pedestal oxide layer 4 has been formed on this layer 3, and the entire stack is protected by a stop layer 5 (for example, made of silicon nitride). A dielectric 10 fills the trenches and covers the active regions. Insulating pads 7 are located around the perimeter of the active regions at predetermined intervals and placed against the sidewalls of the active regions.

Figure 1I:
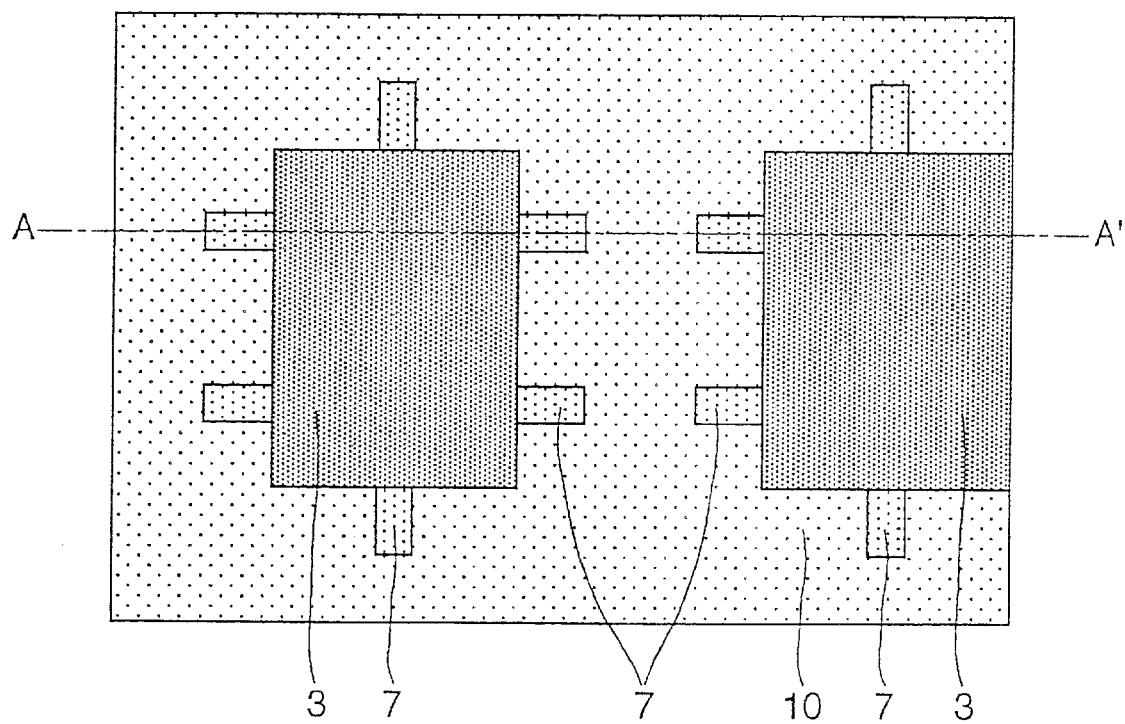

Finishing steps identical to those used in STI technology are then performed in the illustrated embodiment. More specifically, the excess dielectric 10 is removed after chemical-mechanical polishing. Next, the mask 5 and the pedestal oxide 4 are removed, so as to obtain the substrate illustrated in cross section in FIG. 1h. FIG. 1i illustrates the device shown in FIG. 1h in a view from above. The active regions, the silicon epilayer 3 of which is visible, are surrounded by an insulating region 10 (the trenches) in which insulating pads 7 are placed against the sidewalls of the active regions and are located at predetermined intervals around the perimeter of the active regions.

Because the SiGe alloy is removed just after its growth and the photolithographic etching, without any thermal step (no annealing) between these two steps, the stability of this layer is promoted. The percentage of Ge can be increased in the alloy above those values usually ensuring thermal stability of the layer. Moreover, the thickness of the alloy 2 may be larger. The almost immediate removal of the SiGe or Ge layer thus provides greater freedom with regard to the thermal steps in the rest of the process.

Figure 2A:
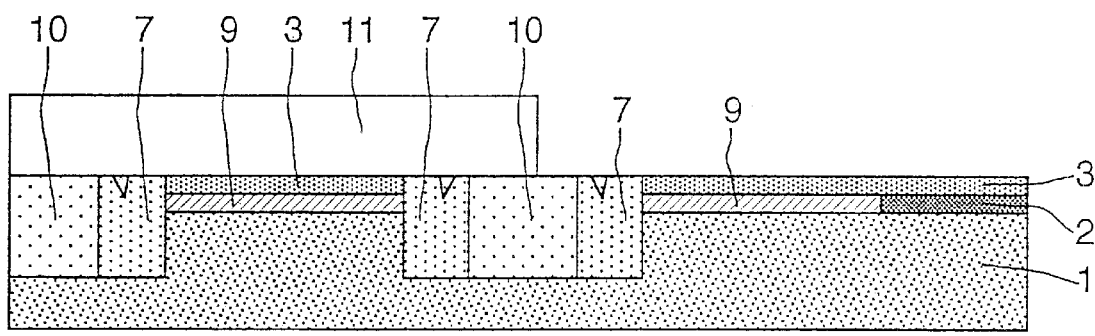
FIGS. 2a and 2b show another embodiment of a process for manufacturing a substrate of SOI architecture in order to produce a bulk region.
Figure 2B:
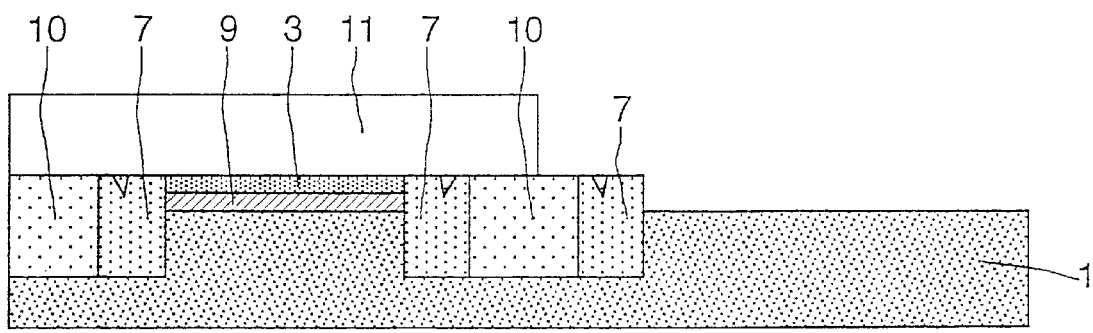

According to another embodiment of the process of the present invention, an SOI region and a bulk substrate region are produced within the same device. This embodiment may be advantageous when excessively large active regions do not allow complete removal of the SiGe or Ge in the tunnel. This embodiment may also be performed with small active regions, according to the requirements of the circuit or sub-circuit to work with bulk transistors on a bulk substrate, rather than on a substrate of SOI architecture. Such a device is obtained from the device shown in FIG. 1h. As shown in FIG. 2a, a resin 11 is used to mask the region where it is desired to retain the SOI architecture. This is followed by the localized removal of the undesirable SOI layers, such as those partly filled with SiGe or Ge residue. For example, these layers can be removed by plasma etching in order to obtain the device illustrated in FIG. 2b.

Figure 3:
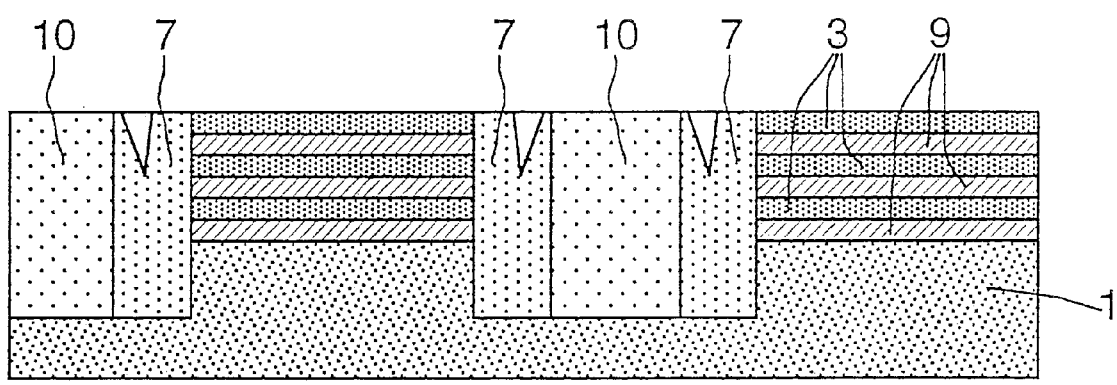
FIG. 3 shows a further embodiment of a process for manufacturing a substrate of SOI architecture in order to produce an SOI multilayer substrate.

Another embodiment of the process of the present invention is especially suited for the purpose of an application involving the three-dimensional integration of the semiconductor devices produced in the SOI substrate. This process starts with a successive deposition, by non-selective full-wafer epitaxy, of several SiGe or Ge layers 2 and silicon layers 3 in alternation. The SOI substrate thus obtained is illustrated in FIG. 3, in which the active regions are in the form of an alternation of dielectric layers 9 and silicon layers 3. Insulating pads 7 are located in the insulating trench regions around the perimeter of the active region at predetermined intervals and placed against the sidewalls of the active region.

According to further embodiments of the present invention, the process is used to fabricate a substrate of SON architecture. In such embodiments, the trenches are filled with a dielectric 10 (especially using STI technology) directly after the lateral etching of the SiGe or Ge layer 2. Thus, in the final substrate, an empty tunnel 8 will be subjacent to the silicon layer 3. In practical applications, it may be advantageous to not leave the tunnel completely empty, but to passivate its walls by thermal oxidation, but sufficiently lightly enough not to completely fill the tunnel.

According to other embodiments of the present invention, it is also possible to produce a multilayer substrate of SON architecture having an empty tunnel 8 and silicon epilayer 3 alternation, and to produce a substrate having an SON region and a bulk substrate region, by carrying out a analogous process to that described above for the SOI-type substrate.

Accordingly, an SOI or SON substrate fabricated in accordance with the process of the present invention is advantageously suited for producing semiconductor devices, and preferably transistors (especially MOS, CMOS, HCMOS and BICMOS transistors). The semiconductor device is conventionally produced on the substrate.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for fabricating a substrate of SOI architecture, said method comprising the steps of:

growing a multilayer stack by non-selective full-wafer epitaxy on an initial substrate, the multilayer stack including a Ge or SiGe alloy first layer and a silicon layer on the first layer;

defining and masking a plurality of active regions;

forming a plurality of insulating pads, the insulating pads being located on the perimeter of each of the active regions at predetermined intervals and being placed against sidewalls of the active regions;

etching trenches for separating the active regions;

laterally etching the Ge or SiGe alloy first layer so as to form an empty tunnel under the silicon layer;

filling the tunnel with a dielectric material; and filling the trenches with a dielectric material.

2. The method according to claim 1, wherein the Ge or SiGe alloy first layer grown by non-selective fall-wafer epitaxy has a thickness of between about 1 and 50 nm, and the silicon layer grown by non-selective fall-wafer epitaxy has a thickness of between about 1 and 50 nm.

3. The method according to claim 1, wherein the Ge or SiGe alloy first layer grown by non-selective full-wafer epitaxy has a thickness of between about 10 and 30 nm, and the silicon layer grown by non-selective full-wafer epitaxy has a thickness of between about 5 and 20 nm.

4. The method according to claim 1, wherein the step of forming a plurality of insulating pads includes the sub-steps of:

depositing a resin over the entire surface of the initial substrate;

using photolithography to form patterns of holes to be etched, the patterns being located at defined intervals around the perimeter of the active regions, and each overlapping active regions and an adjacent trench region;

plasma etching to form holes in the trench regions not covered by the resin;

removing the resin;

depositing a dielectric in order to fill the holes; and anisotropic etching.

5. The method according to claim 1, wherein the dielectric material used to fill the tunnel is $SiO_2$.

6. The method according to claim 1, wherein the step of filling the tunnel includes the sub-steps of:

passivating the walls of the tunnel; and subsequently completely filling the tunnel with a dielectric material other than $SiO_2$.

7. The method according to claim 1, wherein the dielectric material used to fill the trenches is $SiO_2$.

8. The method according to claim 1, further comprising the steps of:

forming a bulk region in the substrate by masking the SOI region to be maintained; and removing the silicon layer and the dielectric layer in unmasked regions.

9. The method according to claim 1, wherein the multilayer stack includes an alternation of SiGe or Ge alloy layers and silicon layers, with at least two of each of these layers.

10. The method according to claim 1, wherein the initial substrate is silicon.

11. A method for fabricating a substrate of SON architecture, said method comprising the steps of:

growing a multilayer stack by non-selective full-wafer epitaxy on an initial substrate, the multilayer stack including a Ge or SiGe alloy first layer and a silicon layer on the first layer;

defining and masking a plurality of active regions;

forming a plurality of insulating pads, the insulating pads being located on the perimeter of each of the active regions at predetermined intervals and being placed against sidewalls of the active regions;

etching trenches for separating the active regions;

laterally etching the Ge or SiGe alloy first layer so as to form an empty tunnel under the silicon layer; and filling the trenches with a dielectric material.

12. The method according to claim 11, wherein the Ge or SiGe alloy first layer grown by non-selective full-wafer epitaxy has a thickness of between about 1 and 50 nm, and the silicon layer grown by non-selective full-wafer epitaxy has a thickness of between about 1 and 50 nm.

13. The method according to claim 11, wherein the Ge or SiGe alloy first layer grown by non-selective full-wafer epitaxy has a thickness of between about 10 and 30 nm, and the silicon layer grown by non-selective full-wafer epitaxy has a thickness of between about 5 and 20 nm.

14. The method according to claim 11, wherein the step of forming a plurality of insulating pads includes the sub-steps of:

depositing a resin over the entire surface of the initial substrate;

using photolithography to form patterns of holes to be etched, the patterns being located at defined intervals around the perimeter of the active regions, and each overlapping active regions and an adjacent trench region;

plasma etching to form holes in the trench regions not covered by the resin;

removing the resin;

depositing a dielectric in order to fill the holes; and anisotropic etching.

15. The method according to claim 11, wherein before the step of filling the trenches, the walls of the tunnel are passivated.

16. The method according to claim 11, wherein the dielectric material used to fill the trenches is $SiO_2$.

17. The method according to claim 11, further comprising the steps of:

forming a bulk region in the substrate by masking the SON region to be maintained; and removing the silicon layer in unmasked regions.

18. The method according to claim 11, wherein the multilayer stack includes an alternation of SiGe or Ge alloy layers and silicon layers, with at least two of each of these layers.

19. The method according to claim 11, wherein the initial substrate is silicon.

* * * * *